United States Patent
Heo et al.

(10) Patent No.: US 6,940,321 B2
(45) Date of Patent: Sep. 6, 2005

(54) CIRCUIT FOR GENERATING A DATA STROBE SIGNAL USED IN A DOUBLE DATA RATE SYNCHRONOUS SEMICONDUCTOR DEVICE

(75) Inventors: Nak-Won Heo, Kyungki-do (KR); Chang-Sik Yoo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/728,630

(22) Filed: Dec. 5, 2003

(65) Prior Publication Data

US 2004/0145962 A1 Jul. 29, 2004

(30) Foreign Application Priority Data

Jan. 23, 2003 (KR) .................................. 10-2003-0004578

(51) Int. Cl.[7] .............................. H03B 1/00; H03B 3/00
(52) U.S. Cl. ........................ 327/112; 365/193; 365/233
(58) Field of Search ................................ 327/108, 112; 326/82, 83, 86, 87; 365/193, 233, 189.05

(56) References Cited

U.S. PATENT DOCUMENTS

| | | | |
|---|---|---|---|
| 6,002,613 A | * 12/1999 | Cloud et al. | ........... 365/189.01 |
| 6,078,546 A | * 6/2000 | Lee | .............................. 365/233 |
| 6,198,674 B1 | * 3/2001 | Kim | ........................... 365/193 |
| 6,288,971 B1 | * 9/2001 | Kim | ........................... 365/233 |
| 6,519,188 B2 | * 2/2003 | Ryoo et al. | ............. 365/189.05 |
| 6,791,888 B2 | * 9/2004 | Kang | ......................... 365/193 |

FOREIGN PATENT DOCUMENTS

| | | |
|---|---|---|
| JP | 173267 | 6/2000 |
| KR | 2003-0027381 | 5/2000 |
| KR | 2000-0043978 | 7/2000 |

OTHER PUBLICATIONS

English language abstract of Japanese Publication No. 173267.
English language abstract of Korean Publication No. 2000–0027381.
English language abstract of Korean Publication No. 2000–0043978.

* cited by examiner

*Primary Examiner*—Tuan T. Lam
(74) *Attorney, Agent, or Firm*—Marger Johnson & McCollom, P.C.

(57) ABSTRACT

Provided is a circuit for generating a data strobe signal used in a double data rate (DDR) synchronous semiconductor device. The circuit comprises a first logic unit capable of generating a pull up control signal responsive to first and second clock signals. A second logic unit is capable of generating a pull down signal responsive to the first and second clock signals. A data strobe buffer is capable of generating a data strobe signal responsive to the pull up and pull down control signals, the data strobe signal including a preamble. The first logic unit is capable of generating the preamble responsive to a first pulse of the first clock signal. And the data strobe signal is in a high impedance state responsive to a last pulse of the first clock signal.

14 Claims, 6 Drawing Sheets

CIRCUIT FOR GENERATING A DATA STROBE SIGNAL USED IN A DOUBLE DATA RATE SYNCHRONOUS SEMICONDUCTOR DEVICE

BACKGROUND OF THE INVENTION

This application claims the priority from Korean Patent Application No. 2003-04578 filed on Jan. 23, 2003, incorporated herein by reference.

1. Field of the Invention

The present invention relates to a synchronous semiconductor device and, more particularly, to a circuit for generating a data strobe signal used in a double data rate (DDR) synchronous semiconductor device.

2. Description of the Related Art

A synchronous semiconductor device, such as a DDR memory device, outputs data in synchronization with a data strobe signal. FIG. 1 is a timing diagram of signals associated with a typical synchronous semiconductor device. Referring to FIG. 1, the semiconductor device receives an active command ACT or a read command RD synchronized with a clock signal CLK. Responsive to, e.g., the read command RD, the semiconductor device outputs data DOUT after a predetermined number of clock cycles. For a single data input/output pin, data bits e.g., A1–A4 and B1–B4, are each sequentially output responsive to the single read command RD.

When it outputs data, the semiconductor device provides a gate strobe signal DQS. The gate strobe signal DQS enables another device, such as a memory controller, to easily receive the output data DOUT. As shown in FIG. 1, the data strobe signal DQS is in a state of high impedance (Hi-Z) when the device does not output data. The data strobe signal is in an active state (i.e., toggles synchronous to the clock signal CLK) when the device outputs data DOUT. In an active state, the data strobe signal DQS includes a preamble period and postamble periods.

FIG. 2 is a data output circuit of a conventional synchronous semiconductor device. Referring to FIG. 2, the data output circuit is a wave-pipeline-type data output circuit. As the operating speed of semiconductor devices increases, CAS latency also increases. In high-speed semiconductor devices, wave-pipeline-type data output circuits are widely used to embody long CAS latencies of 5–6 or more.

Data is output from a memory cell array 100 to a corresponding array of latches 111–122. The data stored in the latches 111–122 is output to the next latch 130 responsive to pipeline control signals (CDQF1–CDQF6, CDQS1–CDQS6). The data DO stored in the latch 130 is output via a tri-state control circuit 140 to an output data buffer 150.

The tri-state control circuit 140 outputs pull up data DOP and pull down data DON to the output data buffer 150, responsive to the data DO and a tri-state control signal PTRSTDS.

The output data buffer 150 includes a pull up transistor TP1 and a pull down transistor TN1. The pull up transistor TP1 and the pull down transistor TN1 drive the output data DOUT to a supply voltage VDD or a ground voltage level responsive to the pull up data DOP and the pull down data DON, respectively.

When the tri-state control signal PTRSTDS is at a low level, the pull up data DOP is at a low level and the pull down data DON is at a high level, irrespective of data DO. Accordingly, both the pull up transistor TP1 and the pull down transistor TN1 of the output data buffer 150 are turned off, putting the output data DOUT in a Hi-Z or tri-state.

On the other hand, when the tri-state control signal PTRSTDS is at a high level, the pull up data DOP and the pull down data DON are both at a high or a low levels according to the logic level of the data DO. Accordingly, only one of the pull up transistor TP1 and the pull down transistor TN1 of the output data buffer 150 is turned on to provide data DOUT.

FIG. 3 is a circuit for generating a data strobe signal of a conventional synchronous semiconductor device. Referring to FIG. 3, the conventional circuit for generating a data strobe signal is similar to the data output circuit of FIG. 2.

A high-level signal H or a low-level signal L is input to a latch 230 responsive to one of the pipeline control signals CDQF1–CDQF6 and CDQS1–CDQS6 or a preamble signal CDQPRE. Data DS stored in the latch 230 is output via the tri-state control circuit 240 to a data strobe buffer 250. The preamble signal CDQPRE is a signal for generating a low-level preamble period. Since the pipeline control signals CDQF1–CDQF6 and CDQS1–CDQS6 are activate in order, that is CDQF1, CDQS1, CDQF2, CDQS2, ..., CDQF6, and CDQS6, the high-level signal H and the low-level signal L are alternately input to the latch 230.

The tri-state control circuit 240 outputs a pull up control signal DSP and a pull down control signal DSN to the data strobe buffer 250 responsive to the data DS and the tri-state control signal PTRSTDS.

The data strobe buffer 250 includes a pull up transistor TP2 and a pull down transistor TN2. The pull up transistor TP2 and the pull down transistor TN2 generate a data strobe signal DQS responsive to the pull up control signal DSP and the pull down control signal DSN, respectively.

When the tri-state control signal PTRSTDS is at a low level, the pull up control signal DSP is at a low level and the pull down control signal DSN is at a high level, irrespective of the data DS stored in the latch 230. Accordingly, both the pull up transistor TP2 and the pull down transistor TN2 of the data strobe buffer 250 are turned off, putting the data strobe signal DQS in a Hi-Z state.

On the other hand, when the tri-state control signal PTRSTDS is at a high level, the pull up control signal DSP and the pull down control signal DSN are both at a high level or a low level according to the logic level of the data DS. Accordingly, only one of the pull up transistor TP2 and the pull down transistor TN2 of the data strobe buffer 250 is turned on. As a result, the data strobe signal DQS is at a high level or a low level. That is, when the tri-state control signal PTRSTDS is at a high level, the low-level signal H is latched by CDQPRE to generate the preamble of a strobe signal. Also, the high-level signal H and the low-level signal L are alternately latched by CDQPRE and pipeline control signals CDQF1–CDQF6 and CDQS1–CDQS6 to generate a toggling data strobe signal DQS. Once the tri-state control signal PTRSTDS returns to a low level, a postamble is generated and the data strobe signal returns to a Hi-Z state.

In the conventional circuit for generating a data strobe signal, the tri-state control signal PTRSTDS cannot be precisely synchronized with the data strobe signal DQS. That is, the tri-state control signal PTRSTDS must be synchronized with the data strobe signal DQS at the same time as valid data DS is latched in the latch 230, and then be activated to a high level. If the tri-state control signal PTRSTDS is at a high level before the valid data DS is latched in the latch 230, however, an invalid strobe signal DQS may be generated. Or, if the tri-state control signal PTRSTDS is at a high level after the valid data DS is latched in the latch 230, the preamble period may be shortened.

In the conventional data output circuit as shown in FIG. 2, as the CAS latency increases, the number of latches 111–122 and pipeline control signals CDQFi, CDQSi, i=1–6 increases. Accordingly, the size of the data output circuit also increases. Likewise, the circuit for generating a data strobe signal is larger with increasing CAS latency.

SUMMARY OF THE INVENTION

The present invention addresses disadvantages associated with prior art synchronous semiconductor devices.

The present invention provides a circuit for generating a data strobe signal used in a double data rate (DDR) synchronous semiconductor device. The DDR device can generate a stable and constant data strobe signal in spite of an increase in CAS latency.

In one embodiment, a data strobe circuit comprises a first logic unit capable of generating a pull up control signal responsive to first and second clock signals. A second logic unit is capable of generating a pull down signal responsive to the first and second clock signals. And a data strobe buffer is capable of generating a data strobe signal responsive to the pull up and pull down control signals, the data strobe signal including a preamble. The first logic unit is capable of generating the preamble responsive to a first pulse of the first clock signal. And the data strobe signal is in a high impedance state responsive to a last pulse of the first clock signal.

In another embodiment, a circuit includes a data strobe buffer capable of generating a data strobe signal responsive to pull up and pull down control signals. A first latch is capable of latching a pull up signal at a first node. A second latch is capable of latching a pull down signal at a second node. A first logic circuit is capable of generating the pull up signal responsive to an even data control signal and a preamble control signal. And a second logic circuit is capable of generating the pull down signal responsive to an odd data control signal.

BRIEF DESCRIPTION OF THE DRAWINGS

The features and advantages of the present invention will become more apparent by describing embodiments thereof with reference to the attached drawings in which.

DETAILED DESCRIPTION OF THE INVENTION

Figure 1:
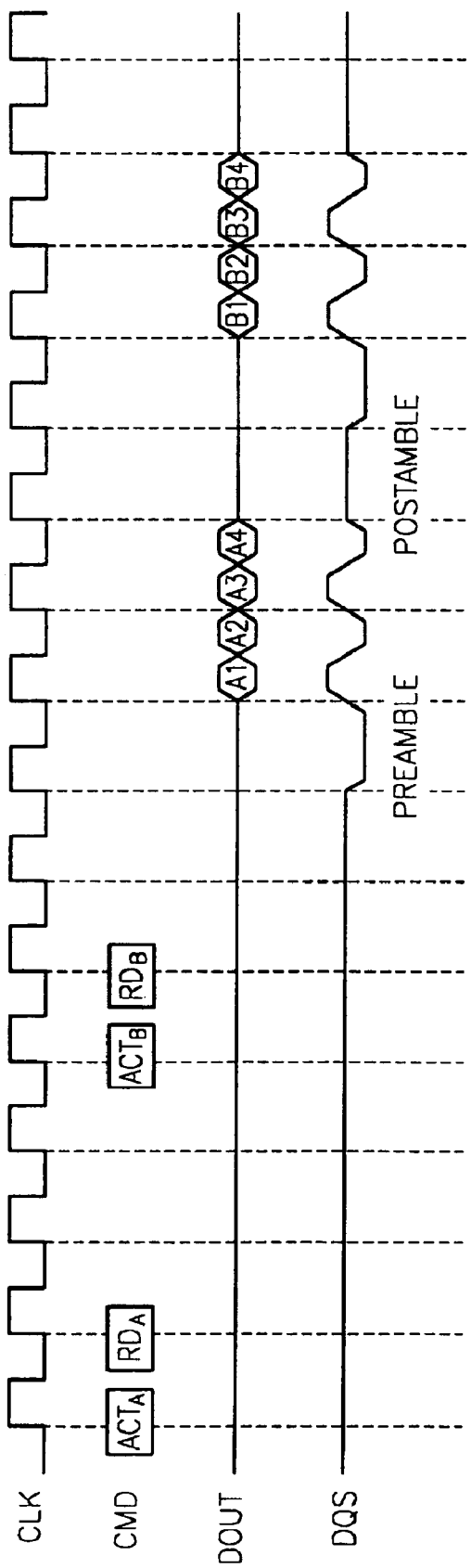
FIG. 1 is a timing diagram of signals associated with a synchronous semiconductor device.
Figure 2:
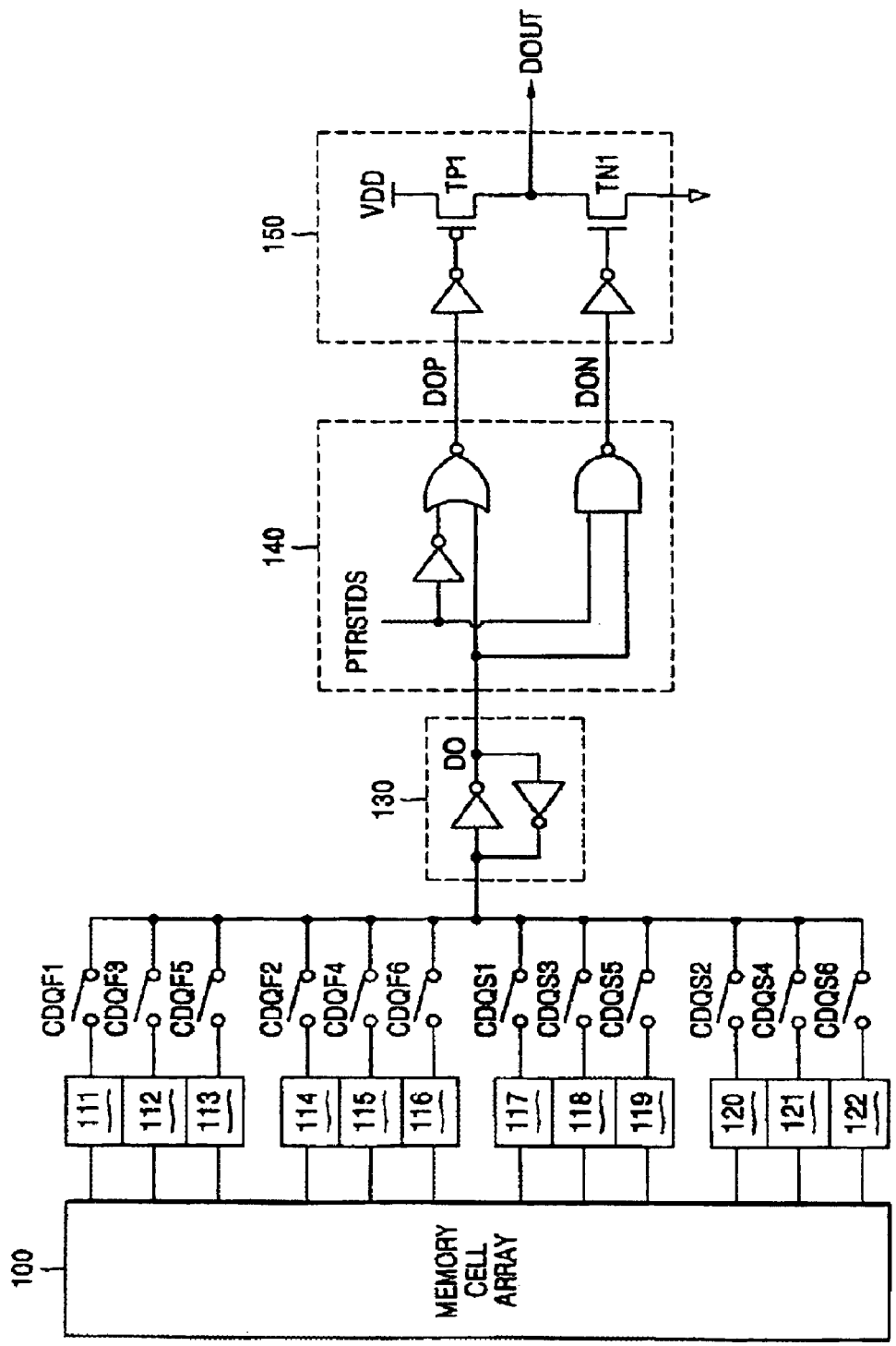
FIG. 2 is a data output circuit of a synchronous semiconductor device.
Figure 3:
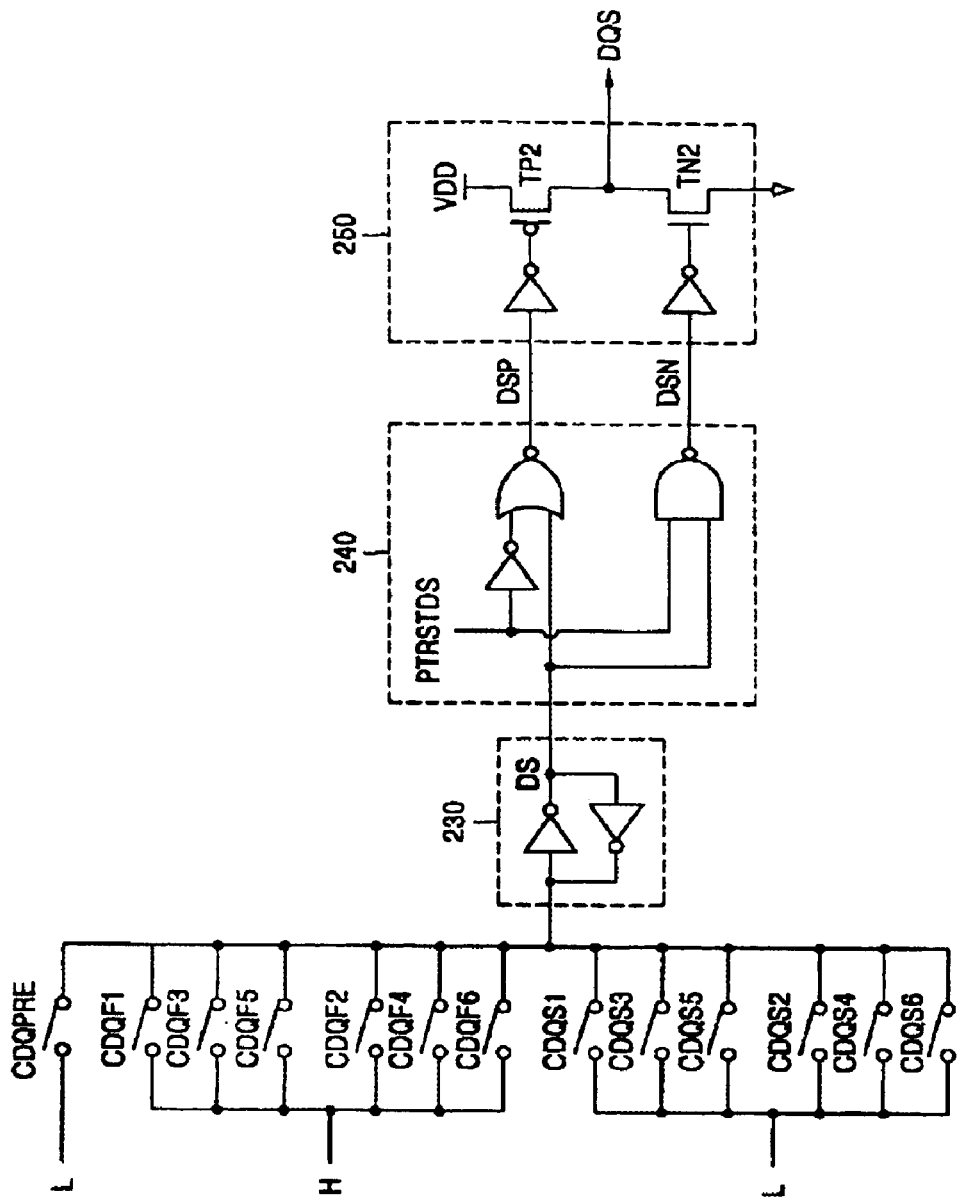
FIG. 3 is a data strobe circuit of a synchronous semiconductor device.

The present invention will now be described more fully with reference to the accompanying drawings, in which preferred embodiments of the invention are shown. The same reference numerals in different drawings represent the same element.

Figure 4:
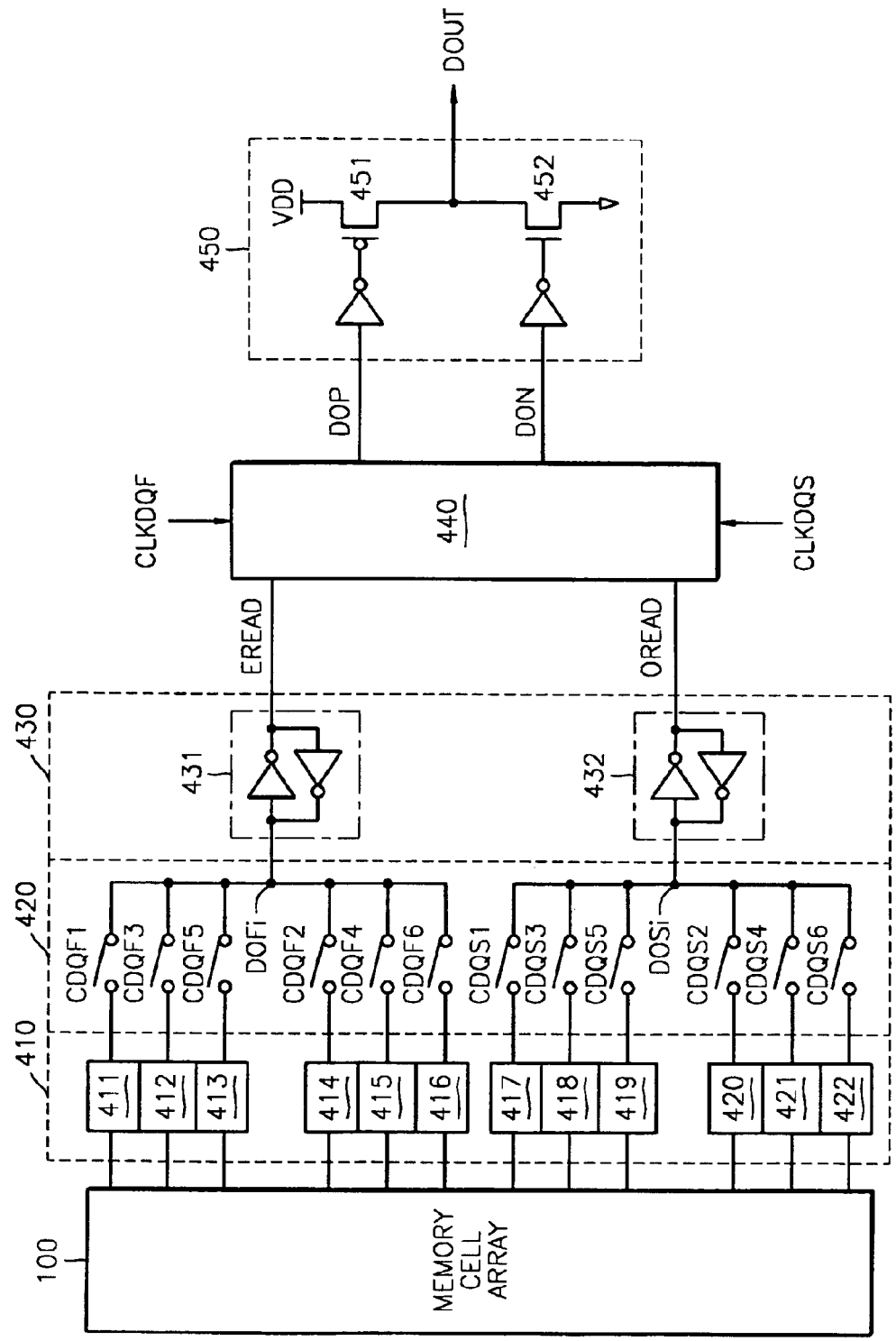
FIG. 4 is a data output circuit of a synchronous semiconductor device according to an embodiment of the present invention.

FIG. 4 is a data output circuit of a synchronous semiconductor device according to an embodiment of the present invention. The data output circuit shown in FIG. 4 is a wave-pipeline-type data output circuit for supporting a CAS latency of 6 (CL=6), tCCD=2 tCK, BL=4, and a 4-bit prefetch type. A person of reasonable skill in the art should understand other embodiments of the data output circuit come within the scope of the present invention.

Referring to FIG. 4, the data output circuit comprises a pipeline circuit unit (410, 420, and 430), a multiplexer 440, and an output data buffer 450.

The pipeline circuit unit comprises a first latch unit 410, a switching unit 420, and a second latch unit 430.

Data is read from a memory cell array 100 and input to a corresponding array of latches 411–422 of the first latch unit 410. The data stored in the latches 411–422 is output to the second latch unit 430 responsive to pipeline control signals CDQF1–CDQF6. Here, the data stored in the latches 411–416 of the first latch unit is multiplexed to an even node DOFi and input to a latch 431, and the data stored in the latches 417–422 of the first latch unit is multiplexed to an odd node DOSi and input to a latch 432. Even data EREAD is read from the latch 431. Odd data OREAD is read from latch 432. Both EREAD and OREAD data are simultaneously input to the multiplexer 440.

The multiplexer 440 receives the even data EREAD and the odd data OREAD and generates pull up data DOP and pull down data DON responsive to an even output clock signal CLKDQF and an odd output clock signal CLKDQS. The even output clock signal CLKDQF and the odd output clock signal CLKDQS have the same frequency as the clock signal CLK. The phases of the odd output clock signal CLKDQS and the even output clock signal CLKDQF are tCK/2 apart.

Accordingly, the multiplexer 440 outputs the pull up data DOP and the pull down data DON, which are DDR data, responsive to 2-bit parallel data (the even data and the odd data) output from the pipeline circuit unit.

The multiplexer 440 may perform operations on the even data EREAD and the odd data OREAD, which are received for tri-state control of the output data buffer 450, with a predetermined tri-state control signal, to generate the pull up data DOP and the pull down data DON.

The output data buffer 450 includes a pull up transistor 451 that operates responsive to the pull up data DOP. A pull down transistor 452 operates responsive to the pull down data DON.

As described above, in the data output circuit as shown in FIG. 4, the data EREAD and OREAD, which is multiplexed and latched by the pipeline circuit unit is multiplexed once more by the multiplexer 440 and output to the output data buffer 450. That is, the data output from the pipeline circuit unit is switched by a predetermined clock signal and then output to the output data buffer 450.

In one embodiment, a similar concept is applied to a circuit for generating a data strobe signal that we describe later.

Figure 5:
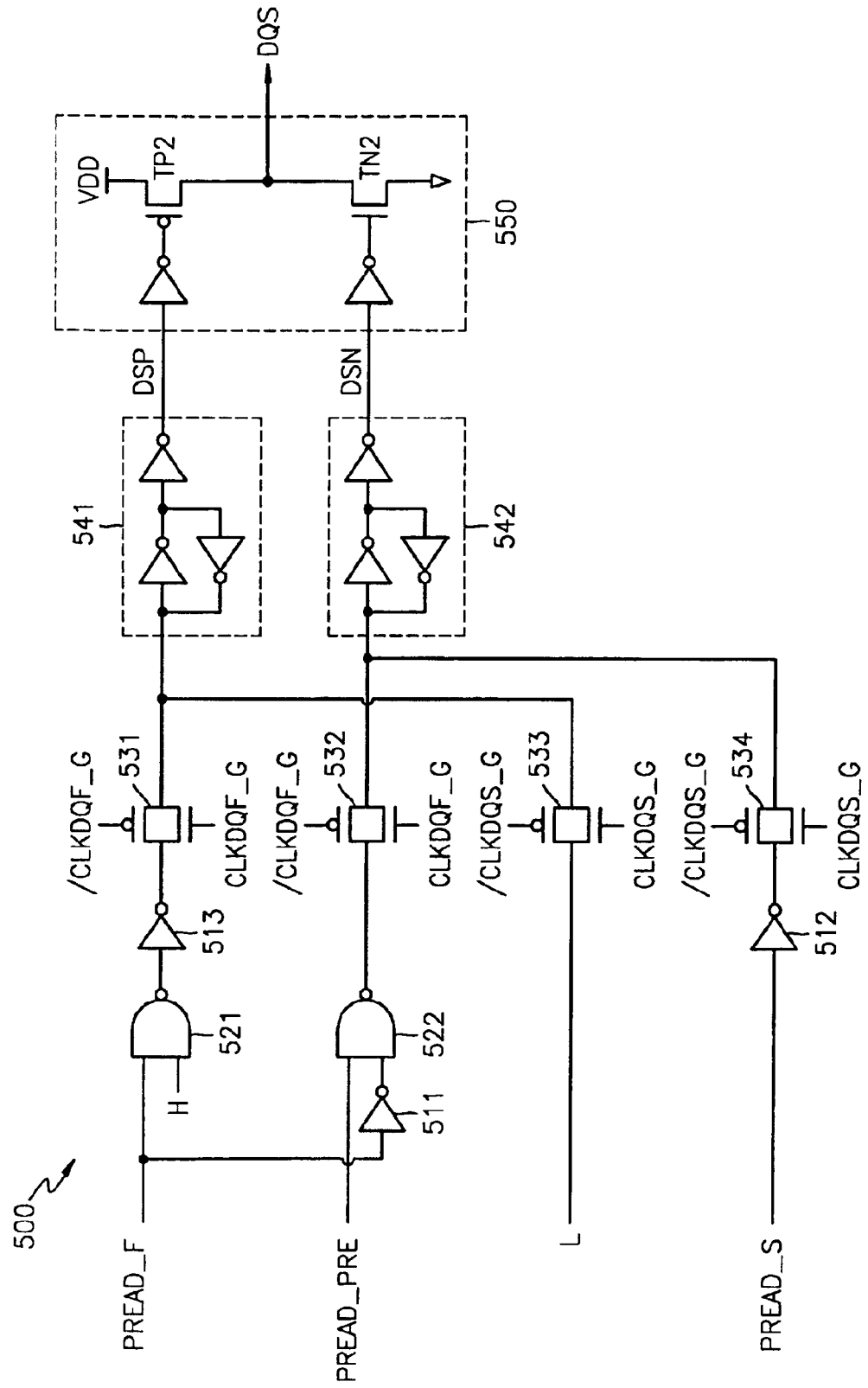
FIG. 5 is a data strobe circuit of a synchronous semiconductor device according to an embodiment of the present invention.

FIG. 5 is a data strobe circuit 500 capable of generating a data strobe signal for the synchronous semiconductor device according to the embodiment of the present invention. Referring to FIG. 5, the data strobe circuit 500 comprises inverters 511–513, NAND gates 521–522, switches 531–534, latches 541 and 542, and a data strobe buffer 550.

The inverters 511–513 are used to invert their respective input signals. The inverter 511 inverts the even data control signal PREAD_F. The inverter 512 inverts an odd data control signal PREAD_S. The NAND gate 521 performs a NAND operation on an even data control signal PREAD_F and a high-level signal H. The NAND gate 522 logically NANDs the preamble control signal PREAD_PRE and the inverted even data control signal PREAD_F. The even data control signal PREAD_F and the odd data control signal PREAD_S are internally generated in the semiconductor device responsive to a read command. Each is active high a predetermined time after the read command, considering CAS latency. The preamble control signal PREAD_PRE is active for a predetermined time producing a preamble period of the data strobe signal DQS.

The switches 531 and 532 operate responsive to a first clock signal CLKDQF_G. The switches 533 and 534 operate responsive to a second clock signal CLKDQS_G. The switches 531–534 are embodied as transmission gates. As will be described in detail later, the first clock signal CLKDQF_G and the second clock signal CLKDQS_G are generated responsive to the even data control signal PREAD_F, the odd data control signal PREAD_S, the preamble control signal PREAD_PRE, the postamble control signal PREAD_PA, an even output clock signal CLKDQF, and an odd output clock signal CLKDQS.

The switch 531 operates responsive to the first clock signal CLKDQF_G and transmits the result of a logic operation on the even data control signal PREAD_F and the high-level signal H to the latch 541. The switch 532 operates responsive to the first clock signal CLKDQF_G and transmits the result of a logic operation on the even data control signal PREDA_F and the preamble control signal PREAD_PRE to the latch 542. The switch 533 operates responsive to the second clock signal CLKDQS_G and transmits the inverted low-level signal L to the latch 541. The switch 534 operates responsive to the second clock signal CLKDQS_G and transmits the inverted odd data control signal PREAD_S to the latch 542. The output signals of the latches 541 and 542 are a pull up control signal DSP and a pull down control signal DSN, respectively, both are input to the data strobe buffer 550.

The data strobe circuit 500 operates as follows. Where the switches 531 and 532 are turned on responsive to the first clock signal CLKDQF_G and the preamble control signal PREAD_PRE is at a high level and the even data control signal PREAD_F is at a low level, both the pull up control signal DSP and the pull down control signal DSN are at a low level. Thus, only a pull down transistor 552 of the data strobe buffer 550 is turned on, generating a low-level data strobe signal DQS.

When the preamble control signal PREAD_PRE and the even data control signal PREAD_F are at a high level, both the pull up control signal DSP and the pull down control signal DSN are at a high level. Thus, only a pull up transistor 551 of the data strobe buffer 550 is turned on, generating a high-level data strobe signal DQS. When the preamble control signal PREAD_PRE and the even data control signal PREAD_F are at a low level, the pull up control signal DSP and the pull down control signal DSN are at a high level. Thus, both the pull up transistor 551 and the pull down transistor 552 of the data strobe buffer 550 are turned off, to put the data strobe signal DQS into a Hi-Z state.

Where the switches 533 and 534 are turned on responsive to the second clock signal CLKDQS_G and the odd data control signal PREAD_S is at a high level, both the pull up control signal DSP and the pull down control signal DSN are at a low level. Accordingly, only the pull down transistor 552 of the data strobe buffer 550 is turned on, generating a low-level data strobe signal DQS. However, when the odd data control signal PREAD_S is at a low level, the pull up control signal is at a low level and the pull down control signal DSN is at a high level. Thus, both the pull up transistor 551 and the pull down transistor 552 of the data strobe buffer 550 are turned off, to put the data strobe signal DQS into a Hi-Z state.

The foregoing operations are shown in Table 1.

TABLE 1

| PREAD_PRE | PREAD_F | PREAD_S | DSP | DSN | DQS |
|---|---|---|---|---|---|
| H | L | — | L | L | L |
| H | H | — | H | H | H |
| L | L | — | L | H | Hi-Z |
| — | — | H | L | L | L |
| — | — | L | L | H | Hi-Z |

Figure 6:
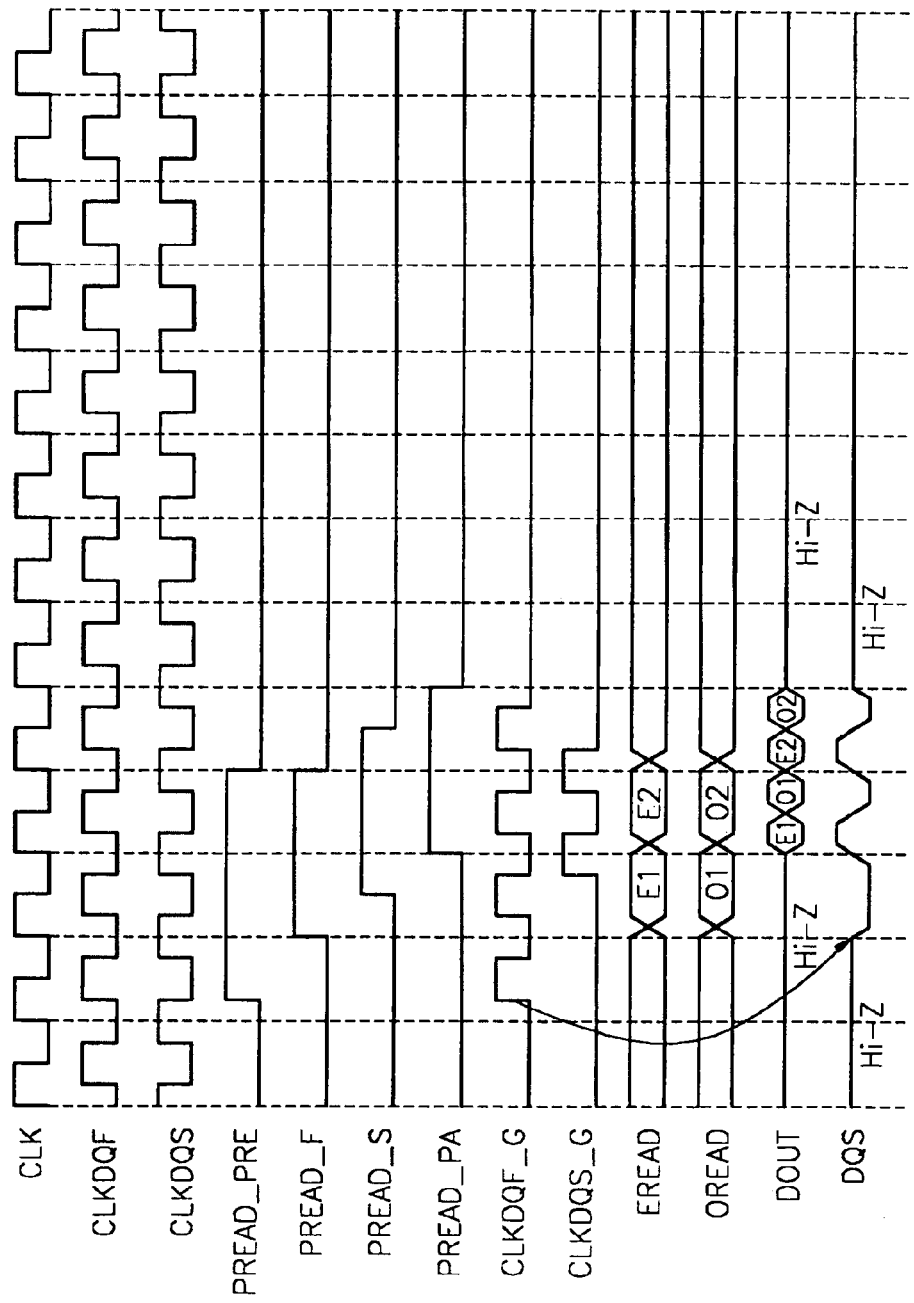
FIG. 6 is a timing diagram of signals associated with the circuits shown in FIG. 4 and FIG. 5.

FIG. 6 is a timing diagram of signals associated with the circuits shown in FIGS. 4 and 5. The even data control signal PREAD_F for controlling the output of the even data EREAD is enabled to a high level at a predetermined time responsive to a read command, and is disabled at a predetermined time. The odd data control signal PREAD_S for controlling the output of the odd data OREAD is enabled to a high level at a predetermined time responsive to a read command. The preamble control signal PREAD_PRE and the postamble control signal PREAD_PA for controlling the preamble and the postamble of the data strobe signal DQS are active to a high level for a predetermined time.

In a case where the burst length BL is 4, since 4 output data are sequentially output via one data output pin, a clock signal having two pulses for outputting the even data EREAD and a signal having two pulses for outputting the odd data OREAD are required. Similarly, a signal having two pulses is required for outputting the data strobe signal DQS while data is being output. In the present embodiment, however, a signal having one pulse is further generated to produce the preamble and the postamble of the data strobe signal DQS.

The first clock signal CLKDQF_G is obtained by performing a logical operation on the even output clock signal CLKDQF and the logical sum of the preamble control signal PREAD_PRE, the even data control signal PREAD_F, and the postamble control signal PREAD_PA. The second clock signal CLKDQS_G is obtained by performing a logical sum of the odd data control signal PREAD_S and the odd output clock signal CLKDQS. That is, while the preamble control signal PREAD_PRE, the even data control signal PREAD_F, or the postamble control signal PREAD_PA are at a high level, the first clock signal CLKDQF_G is at a same logic level as the even output clock signal CLKDQF. And while the odd data control signal PREAD_S is at a high level, the second clock signal CLKDQS_G is at a same logic level as the odd output clock signal CLKDQF.

When the switches 531 and 532 are turned on responsive to a first rising edge of the first clock signal CLKDQF_G, the preamble control signal PREAD_PRE is at a high level and the even data control signal PREAD_F is at a low level. Thus, a low-level data strobe signal DQS is output by the semiconductor device. This corresponds to the preamble of the data strobe signal DQS. When the switches 531 and 532 are turned on responsive to a second rising edge of the first clock signal CLKDQF_G, both the preamble control signal PREAD_PRE and the even data control signal PREAD_F are at a high level. Thus, a high-level data strobe signal DQS is output by the semiconductor device.

When the switches 533 and 534 are turned on responsive to a first rising edge of the second clock signal CLKDQS_G, the odd data control signal PREAD_S is at a high level. Thus, a low-level data strobe signal DQS is output by the semiconductor device. When the switches 531 and 532 are turned on again responsive to a third rising edge of the first clock signal CLKDQS_G, both the preamble control signal PREAD_PRE and the even data control signal PREAD_F are at a high level. Thus, a high-level data strobe signal DQS is output by the semiconductor device. When the switches 533 and 534 are turned on again responsive to a second rising edge of the second clock signal CLKDQS_G, the odd data control signal PREAD_S is also at a high level. Thus, a low-level data strobe signal DQS is output by the semiconductor device.

When the switches 531 and 532 are turned on again responsive to a fourth rising edge of the first clock signal CLKDQF_G, both the preamble control signal PREAD_PRE and the even data control signal READ_F are at a low level. Thus, the data strobe signal DQS is in a Hi-Z state.

Meanwhile, the even data EREAD, input to the multiplexer 440, is preferably output as the pull up data DOP and the pull down data DON responsive to the second and third rising edges of the first clock signal CLKDQS_G. The even data EREAD is preferably output as the pull up data DOP and the pull down data DON responsive to the second clock signal CLKDQS_G. Thus, the output data DOUT of the output data buffer 450 is synchronized with a toggling period of the data strobe signal DQS.

As described above, in the circuit for generating the data strobe signal of the present invention, when the switches 531 and 532 are turned on, the preamble control signal PREAD_PRE is at a high level and the even data control signal PREAD_F is at a low level. Thus, a preamble period of the data strobe signal DQS is generated. When both the even data control signal PREAD_F and the odd data control signal PREAD_S are at a high level, and the switches 531 and 532 and the switches 533 and 534 are alternately switched, the data strobe signal DQS is toggled to a high level and a low level. After the output data DOUT is output, when the switches 531 and 532 are turned on again, if both the preamble control signal PREA_PRE and the even data control signal PREAD_F are at a low level, the data strobe signal DQS is in a Hi-Z state.

According to the present invention, a high-level signal H and a low-level signal L need not be accurately synchronized with the control signals (PREAD_PRE, PREAD_F, PREAD_S, and PREAD_PA) to generate the data strobe signal DQS. This is in contrast to semiconductor devices in which the data DS must be precisely synchronized with a tri-state control signal PTRSTDS for controlling the Hi-Z state of the data strobe signal DQS.

According to the present invention, the data strobe signal DQS is more stable and easily generated than in prior circuits. Further, even if the CAS latency is increased, the circuit for generating a data strobe signal maintains its constant size.

While the present invention has been particularly shown and described with reference to exemplary embodiments thereof, it will be understood by those of ordinary skill in the art that various changes in form and details may be made therein without departing from the spirit and scope of the present invention as defined by the following claims.

We claim:

1. A data strobe circuit, comprising:
   a first logic unit to generate a pull up control signal responsive to first and second clock signals;
   a second logic unit to generate a pull down sign responsive to the first and second clock signals; and
   a data strobe buffer to generate a data strobe signal responsive to the pull up and pull down control signals, the data strobe signal including a preamble;
   where the first logic unit is to generate the preamble responsive to a first pulse of the first clock signal; and
   where the data strobe signal is in a high impedance state responsive to last pulse of the first clock signal.

2. The data strobe circuit of claim 1
   where the data strobe signal is in a first logic level responsive to the pull up and pull down control signals that are, in turn, responsive to pulses other than the first and last pulse of the first clock signal; and
   where the data strobe signal is in a second logic level responsive to the pull up and pull down control signals that are, in turn, responsive to the second clock signal.

3. The data strobe circuit of claim 1 where the second lock signal is ½ cycle out of phase from the first clock signal.

4. The data strobe circuit of claim 1
   where the first logic unit is to receive an even data control signal responsive to a read command; and
   where the second logic unit is to receive an odd data control signal responsive to the read command.

5. The data strobe circuit of claim 1 where the first logic unit includes:
   a first logic gate to generate a first output signal by logically manipulating an even data control signal and a logic high signal;
   a second logic gate to generate a second output signal by inverting the first output;
   a first transmission gate to provide the second output signal to a first output node responsive to the first clock signal; and
   a second transmission gate to provide a logic low signal to the first output node responsive to the second clack signal.

6. The data strobe circuit of claim 5 where the second logic unit includes:
   a third logic gate to generate a third output signal by inverting the even data control signal;
   a fourth logic gate to generate a fourth output signal by logically manipulating a preamble control signal and the third output signal;
   a third transmission gate to provide the fourth output signal to a second output node responsive to the first clock signal;
   a fifth logic gate to generate a sixth output signal by inverting an odd data control signal; and
   a fourth transmission gate to generate the sixth output signal to the second output node responsive to the second clock signal.

7. The data strobe circuit of claim 1 where the data strobe buffer comprises:
   a pull up transistor operating responsive to the pull up control signal; and
   a pull down transistor operating responsive to the pull down control signal.

8. A circuit, comprising:
   a data strobe buffer to generate a data strobe signal responsive to pull up and pull down control signals;
   a first latch to latch a pull up signal at a first node;
   a second latch to latch a pull down signal at a second node;

a first logic circuit to generate the pull up signal responsive to an even data control signal and a preamble control signal; and a second logic circuit to generate the pull down signal responsive to an odd data control signal;

where the first and second logic circuits operates responsive to first an second clock signals.

9. The circuit of claim 8 where the second clock signal is out of phase relative to the first clock signal.

10. The circuit of claim 8 where the data strobe buffer comprises:

a first inverter to invert the pull up signal;

a second inverter to invert the pull down signal;

a pull up transistor to generate the data strobe signal responsive to the inverted pull up signal; and a pull down transistor to generate the data strobe signal responsive to the inverted pull down signal.

11. The circuit of claim 8 where the first latch includes a first inverter to invert a latched pull up signal; and where the second latch includes a second inverter to invert a latched pull down signal.

12. A circuit comprising:

a data strobe buffer to generate a data strobe signal responsive to pull up and pull down control signals;

a first latch to latch a pull up signal at a first node;

a second latch to latch a pull down signal at a second node;

a first logic circuit to generate the pull up signal responsive to an even data control signal and a preamble control signal; and a second logic circuit to generate the pull down signal responsive to an odd data control signal;

where the first logic circuit comprises:

a logic gate to logically manipulate the even data control signal with a logic high level signal;

an inverter to invert an output of the logic gate;

a first transmission gate to provide an output of the inverter as the pull up signal responsive to a first clock signal; and a second transmission gate to provide a logic low level signal as the pull up signal responsive to the second clock signal.

13. A circuit, comprising:

a data strobe buffer to generate a data strobe signal responsive to pull up and pull down control signals;

a first latch to latch a pull up signal at a first node;

a second latch to latch a pull down signal at a second node;

a first logic circuit to generate the pull up signal responsive to an even data control signal and a preamble control signal; and a second logic circuit to generate the pull down signal responsive to an odd data control signal;

where the second logic circuit comprises:

a first inverter to invert the even data control signal;

a logic gate to logically manipulate an output of the first inverter with the preamble control signal;

a first transmission gate to provide an output of the logic gate as the pull down signal responsive to the first clock signal;

a second inverter to invert the odd data control signal; and a second transmission gate to provide an output of the second inverter as the pull down signal responsive to the second clock signal.

14. The circuit of claim 8 where the even and odd data and preamble control signals operate responsive to a read command.

* * * * *

UNITED STATES PATENT AND TRADEMARK OFFICE
CERTIFICATE OF CORRECTION

| | |
|---|---|
| PATENT NO. | : 6,940,321 B2 |
| APPLICATION NO. | : 10/728630 |
| DATED | : September 6, 2005 |
| INVENTOR(S) | : Heo et al. |

It is certified that error appears in the above-identified patent and that said Letters Patent is hereby corrected as shown below:

At cover sheet, item 56, foreign patent documents, please replace "KR 2003" with --KR 2000--

At column 8, line 1, please replace "sign" with --signal--

At column 8, line 9, please replace "to last pulse" with --to a last pulse--

At column 8, line 19, please replace "lock" with --clock--

At column 8, line 37, please replace "clack" with --clock--

At column 8, line 45, please replace "a preamble control signal" with --the preamble and the third output signal--

At column 8, line 62, please replace "A circuit, comprising" with --A circuit comprising--

At column 9, line 7, please replace "first an second" with --first and second--

At column 10, line 11, please replace "A circuit, comprising" with --A circuit comprising--

Signed and Sealed this

Twelfth Day of December, 2006

JON W. DUDAS
*Director of the United States Patent and Trademark Office*